INVENTOR
RICHARD F. RUTZ

BY Alvin J. Riddles
ATTORNEY

March 7, 1967 R. F. RUTZ 3,308,356

SILICON CARBIDE SEMICONDUCTOR DEVICE

Filed June 30, 1964 3 Sheets-Sheet 2

March 7, 1967 R. F. RUTZ 3,308,356

SILICON CARBIDE SEMICONDUCTOR DEVICE

Filed June 30, 1964 3 Sheets-Sheet 3

United States Patent Office 3,308,356

Patented Mar. 7, 1967

3,308,356

SILICON CARBIDE SEMICONDUCTOR DEVICE

Richard F. Rutz, Cold Spring, N.Y., assignor to International Business Machines Corporation, New York, N.Y., a corporation of New York Filed June 30, 1964, Ser. No. 379,225
18 Claims. (Cl. 317—237)

This invention is directed to silicon carbide semiconductor devices and in particular to a rectifying connection in a silicon carbide semiconductor device.

Electrical circuit devices when made of the material silicon carbide, retain their performance at temperatures many times higher than those of the semiconductor materials currently in use. However, this material has been difficult to use because electrical connections to the material require temperatures so high that the silicon carbide compound may dissociate and/or significant diffusion can occur. U.S. Patent 2,918,396 describes a method of making silicon carbide semiconductor devices wherein silicon is fused along with quantities of conductivity type determining impurities. The technique of U.S. Patent 2,918,396, while effective for certain types of structures, has been of limited value for reliable reproducible devices and has been unable to produce quantum mechanical tunneling (Esaki diode) type devices.

It has been discovered that a reproducible and reliable electrical connection can be made to a semiconductor device made of silicon carbide through the use of silicon, fused to a body of P conductivity type silicon carbide wherein the fusion is performed with a very rapid fusion temperature cycle in the presence of a gas containing an N conductivity type impurity.

It is a primary object of this invention to provide an improved electrical connection to a silicon carbide semiconductor device.

It is an object of this invention to provide an improved p-n junction in a silicon carbide semiconductor device.

It is another object of this invention to provide a silicon carbide quantum mechanical tunneling device.

It is another object of this invention to provide an improved method of making silicon carbide devices.

It is another object of this invention to provide a method of making silicon carbide quantum mechanical tunneling devices.

It is another object of this invention to provide a silicon carbide diode oscillator.

The foregoing and other objects, features and advantages of the invention will be apparent from the following more particular description of preferred embodiments of the invention, as illustrated in the accompanying drawings.

Figure 1:
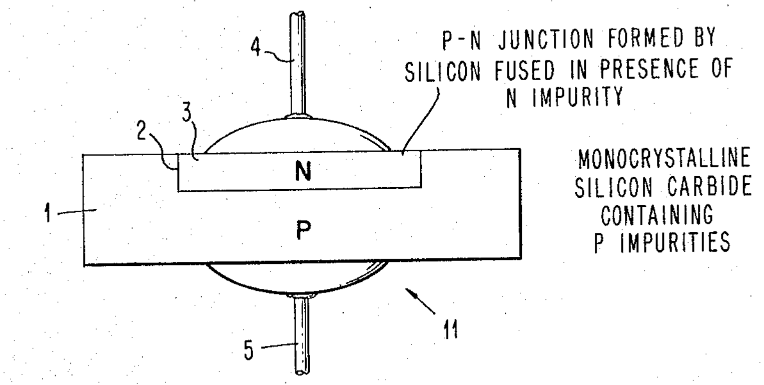
FIG. 1 is a view of a silicon carbide semiconductor device containing the electrical connection of this invention.

The electrical connection of the invention involves the formation of a p-n junction in a P conductivity type crystalline silicon carbide body by a fusion of silicon into the P type body in the presence of a gas containing an N conductivity type determining impurity. Impurities that may be present in the silicon do not influence conductivity type. As an order of magnitude figure, the impurity concentration in the silicon before fusion is in the vicinity of $2\times10^{13}$ atoms per cc., but impurity concentrations as high as 1% of either N or P type have been found to have no discernable effect.

In the fabrication of the electrical connection of the invention, a monocrystalline body of silicon carbide is provided with a P conductivity type impurity such as aluminum. When it is desired to employ the connection of the invention for quantum mechanical tunneling (Esaki diode) purposes, the P type impurity is introduced in sufficient quantity to make the material degenerate. Degeneracy may be defined as the point at which the concentration of conductivity type determining impurities in the crystal is sufficiently great that the Fermi-level lies within or very closely approaches, the conduction band. This concentration, sufficient for degeneracy, may also be stated as being of the order of approximately $10^{21}$ atoms per cc. Relatively pure silicon fragments are then placed in contact with one surface of the P type silicon carbide body, and the combination is raised to a temperature in the vicinity of 2000° centigrade or higher in an atmosphere containing an N conductivity type impurity such as Forming gas (90% nitrogen, 10% hydrogen) and thereafter returned to lower temperature. The shorter the temperature cycle, the more abrupt the junction and a more pronounced negative resistance is achieved. A short temperature cycle being of the order of ten (10) seconds.

The electrical connection of the invention involves a p-n junction formed in the P type silicon carbide semiconductor body. Where the body is heavily doped with P conductivity type impurities, the temperature cycle is short and is performed in the presence of a gas containing an N conductivity type impurity, the p-n junction then exhibits electrical characteristics similar to a quantum mechanical tunneling junction. Such junctions exhibit a voltage controlled negative resistance in the forward direction at low voltages. This performance has many applications in the art. Such junctions further have a very low back resistance and are useable in the back direction as an ohmic connection. It is further well known that devices based on tunneling current are much more temperature stable than other ordinary p-n junction devices. The connection is reproducible, and may be made time after time without unreasonable control on the criteria. Through modification of the P impurity density of the silicon carbide body and/or the fusion cycle conventional p-n junctions having various desired impurity distributions or variations in asymmetric conduction on characteristic shapes for specific device purposes may be fabricated.

The electrical connection of the invention is illustrated in FIG. 1 in a diode structure wherein the crystalline silicon carbide body is labelled 1. A p-n junction 2 is formed between a fused region 3 which has been formed in the crystalline silicon carbide 1 with a heating cycle in the presence of a gas containing an N conductivity type impurity such as Forming gas (90% nitrogen, 10% hydrogen) which raised the temperature to a vicinity of 2000° and back to room temperature in about a ten (10) second interval. The fusion produces a p-n junction in the silicon carbide crystal. The mechanism by which the junction is formed is not understood. The following is advanced as a possible explanation. The nitrogen from the Forming gas is believed to dissolve in the fused silicon and is incorporated as N conductivity type determining impurities in the silicon carbide device, forming thereby an N region. Ohmic contacts 4 and 5 are provided for signal purposes well known in the art.

Figure 2:
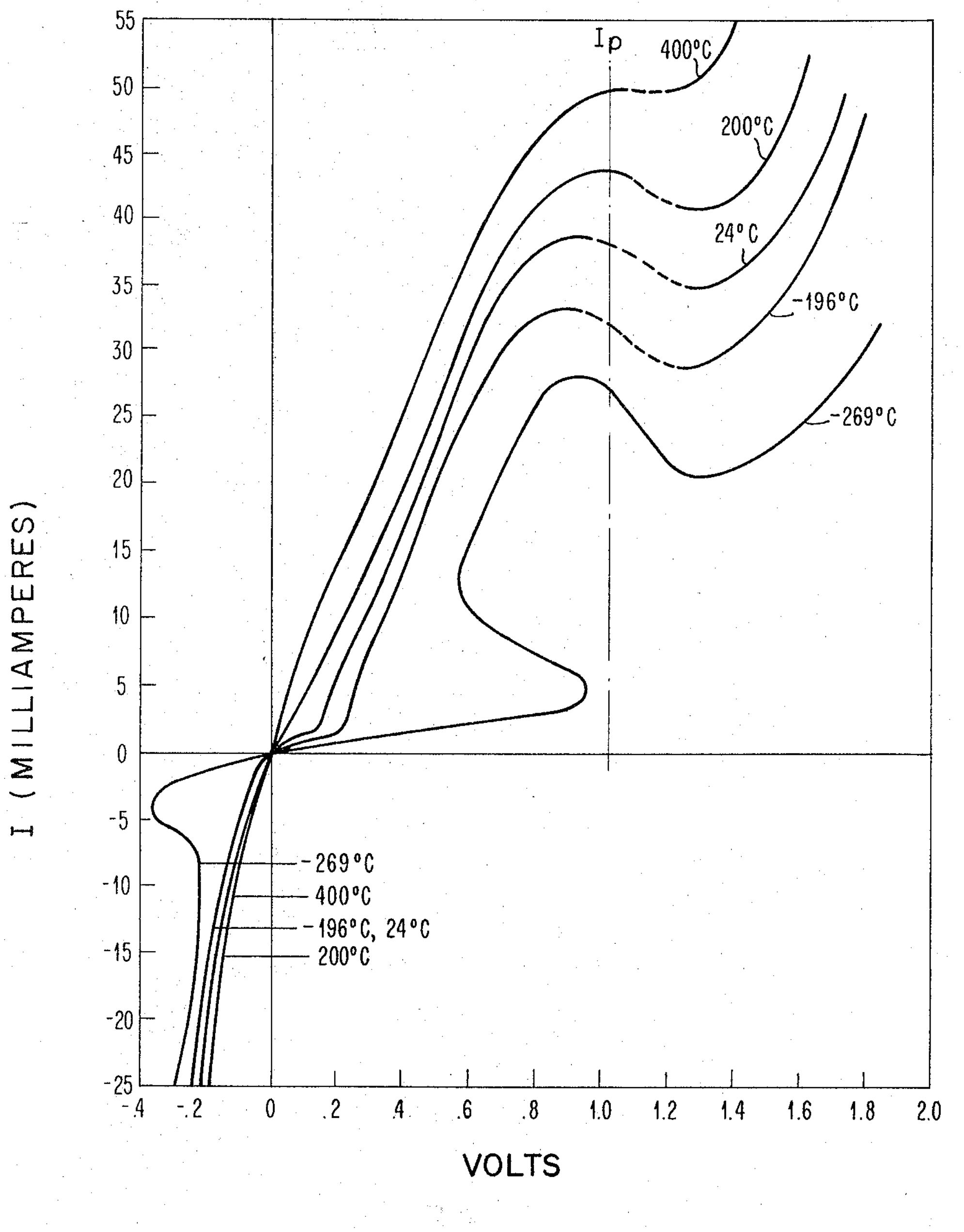
FIG. 2 is a group of characteristic curves illustrating the performance of the invention.

Referring next to FIG. 2, the performance of the silicon carbide electrical connection of the invention is illustrated in terms of its current-voltage characteristics for various temperatures. The characteristic differs from normal tunnel diode characteristic curves in that there is a relatively high impedance at low voltages. In other words, the curves approach the abscissa as they pass through zero.

The peak current of the device, labelled Ip, occurs at approximately one volt forward bias whereas in present tunnel diodes in such materials as germanium and GaAs, this peak is typically the order of 1/10 of a volt. It will then be apparent that these devices have the speed, temperature and radiation resistance of tunnel diodes while at the same time the very low voltage requirement of the tunnel diode devices is somewhat relaxed. The IV characteristic for very low temperatures (−269° centigrade) shows an increasingly high resistance at low voltages and sometimes a second negative resistance of the current controlled variety in the front and back direction. This negative resistance is very temperature dependent.

Since the connection exhibits very low back resistance, it is useable in the back direction as an ohmic connection. The device exhibits visible electroluminescence in the vicinity of the p-n junction under forward current in excess of the tunneling current.

The silicon carbide connection of the invention, as the curves illustrate, provides the asymmetric impedance useful for a rectifying contact, the low back resistance suitable for an ohmic contact and the negative resistance suitable for a quantum mechanical tunneling contact when used independently or as a part of a more involved structure.

Figure 3:
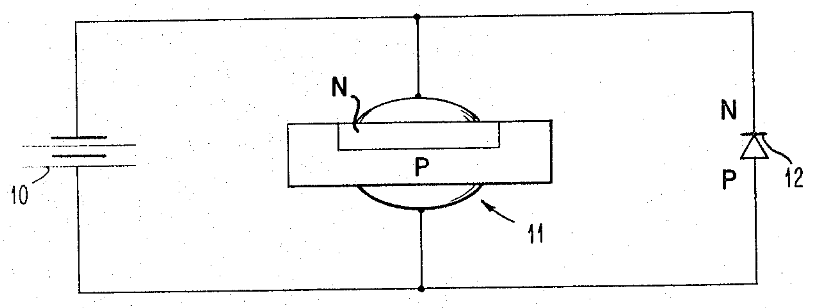
FIG. 3 is a schematic circuit of an oscillator employing the device of this invention.
Figure 4:
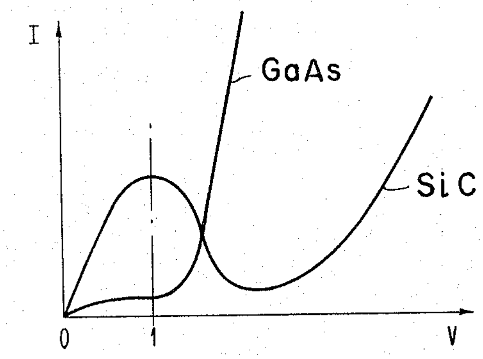
FIG. 4 is the combined IV characteristic curve of the devices of the circuit of FIG. 3.

Referring next to FIG. 3, an illustration is provided of an oscillator circuit comprising a source of power 10, the SiC device of the invention 11, and a conventional GaAs diode 12 connected in parallel. Such an oscillator is described in U.S. Patent 3,054,070. Inductance is present as a lumped parameter and each diode has capacitance. The curves of FIG. 4 are a plot of the relationship of the VI characteristics of the devices. The gallium arsenide or other appropriate diode must have the forward characteristic such that it intersects the silicon carbide curve in the negative resistance region. Also, it must have the proper impedance to satisfy the criteria for oscillation as described in detail in U.S. Patent 3,054,070. It will be apparent that the oscillator of FIG. 3 may be fabricated in a single structure employing a common substrate.

Figure 5:
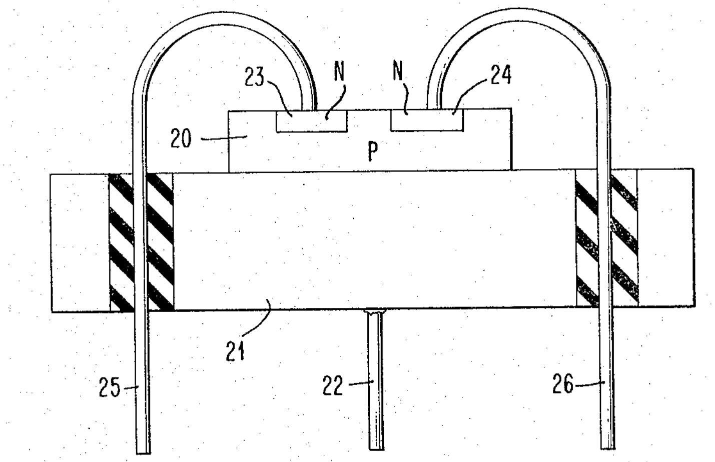
FIG. 5 is an illustration of a device employing a plurality of the electrical connections of the invention.

Referring next to FIG. 5, a structure is illustrated wherein a plurality of electrical connections of the invention are made to a common silicon carbide substrate. In FIG. 5, a P type silicon carbide crystal 20 is ohmically bonded to a tungsten member 21 having an electrical connection 22 thereto. Two separate N conductivity type regions 23 and 24 are formed in the crystal 20 by fusing relatively pure silicon in the presence of nitrogen at 2000° C. for a few seconds. Ohmic connections 25 and 26 are made to regions 23 and 24, respectively, and are shown passing in insulated relationship through the member 21.

Figure 6:
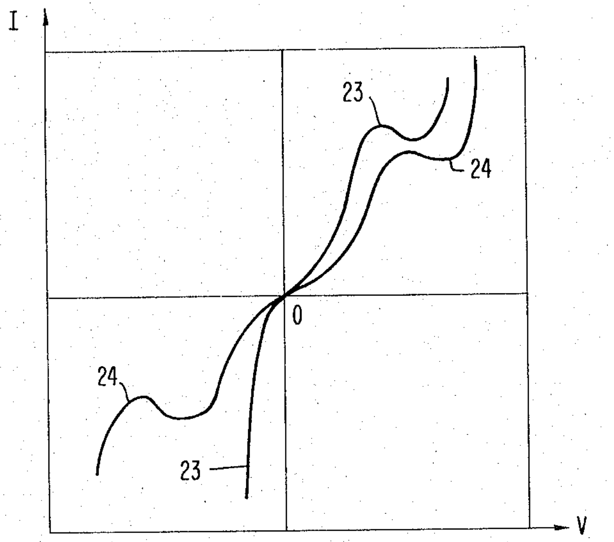
FIG. 6 is a characteristic curve illustrating the performance of the device of FIG. 5.

The devices 23 and 24 are capable of independent IV performance as illustrated in FIG. 6. In FIG. 6, the IV characteristics are plotted through the origin. The device 23 characteristic appearing between terminals 22 and 25 exhibited a higher peak current and lower back resistance whereas the device 24 independently on signals applied between terminals 22 and 26 exhibits a higher peak current and a negative resistance in the back direction.

In order to provide one skilled in the art with a starting place in practicing the invention, the following set of specific values for a diode device are provided although it should be apparent that no limitation is to be construed hereby because in the light of the teaching of the invention, many such sets of practical specifications may readily be envisioned by one skilled in the art.

Very heavily aluminum doped hexagonal silicon carbide crystals, with well defined {0001} faces having a resistivity and mobility by Vander Pohl techniques of 0.16 ohm/cm. and 0.4 volt sec./$cm^2$ respectively, and having a doping density by mass spectroscopy of $4\times10^{21}$ atoms per cc., are employed. The silicon carbide crystal is cleaved perpendicular to the {0001} face with approximately 3000 square mils area and ohmically bonded to a tungsten block at approximately 1900° C.

Small fragments of Si whose purity ranged from as low as about $2\times10^{13}$/cc., total impurity to as high as 1% Ga, (a P type), P (an N type), or As (an N type) are alloyed to the exposed {0001} face of the silicon carbide in a Forming gas atmosphere (90% nitrogen, 10% hydrogen) at slightly above atmosphere pressure for a cycle of about 10–15 seconds at temperatures reaching 2000 to 2200° C. returning to room temperature.

The device so fabricated, when operated in a conventional oscillator circuit produces a few microwatts of power into a 50 ohm load at a frequency of 200 kc. in an environment temperature of 500° C.

What has been described is a technique of providing useful electrical connections in the material silicon carbide for later fabrication into semiconductor devices. The electrical contact of the invention is formed by fusing silicon into P type silicon carbide in the presence of a gas containing an N type impurity.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor connection comprising a body of P conductivity type crystalline silicon carbide containing a p-n junction between a P type region of said crystalline silicon carbide and an N conductivity type region in said body, said latter region being fused into said body and containing a dissolved gas as an N conductivity type determining impurity, said N type region being degenerately doped by said dissolved gas.

2. A diode as set forth in claim 1 wherein said p-n junction is abrupt.

3. A diode as set forth in claim 1 wherein said connection has a negative resistance portion in its current-voltage characteristic.

4. A connection as set forth in claim 1 wherein said dissolved gas is nitrogen.

5. A semiconductor connection comprising a body of P conductivity type crystalline silicon carbide containing a p-n junction between a P type region of said crystalline silicon carbide and an N conductivity type region in said body, said latter region being fused into said body and containing dissolved nitrogen as said N conductivity type determining impurity, both said P-type region and said N-type region being degenerately doped, said latter doping being by said dissolved gas.

6. A diode as set forth in claim 5 wherein said p-n junction is abrupt.

7. A diode as set forth in claim 5 wherein said connection has a negative resistance portion in its current-voltage characteristic.

8. A semiconductor diode comprising a body of P conductivity type crystalline silicon carbide containing a p-n junction between a P type region of said crystalline silicon carbide, and an N conductivity type region in said body, said latter region being fused into said body and containing dissolved nitrogen as an N conductivity type determining impurity, both said P-type region and said N-type region being degenerately doped, said latter region being degenerately doped by said dissolved nitrogen, and an ohmic contact to each of said body of silicon carbide and to said fused region.

9. A semiconductor device comprising a substrate of P conductivity type crystalline silicon carbide containing at least one p-n junction between a P type region of said crystalline silicon carbide, and an N conductivity type region in said body, said latter region being fused into said body and containing dissolved nitrogen as an N conductivity type determining impurity, both said P-type region and said N-type region being degenerately doped, said latter region being degenerately doped by said dissolved nitrogen, and an ohmic contact to each of said body of silicon carbide and to said fused region.

10. An electrical connection in a silicon carbide semiconductor device, said connection having a fused region in a P conductivity type crystal of silicon carbide, said fused region containing dissolved nitrogen as an N conductivity type determining impurity, said fused region having a temperature time cycle parameter in the vicinity of 2000° centigrade for at most ten (10) seconds, both said P type region and said N type region being degenerately doped, said latter region being degenerately doped by said dissolved nitrogen.

11. A silicon carbide semiconductor device comprising a body of P conductivity type crystalline silicon carbide having a fused region containing dissolved nitrogen as an N conductivity type determining impurity having a temperature and time cycle in the vicinity of 2000° centigrade and a quenched parameter therefrom, both said P type region and said N type region being degenerately doped, said latter region being degenerately doped by said dissolved nitrogen, whereby a p-n junction is formed in said silicon carbide body adjacent said fused silicon region and an ohmic connection to each of said silicon carbide body and said fused region.

12. The process of forming an electrical connection in a body of silicon carbide semiconductor material comprising in combination the steps of positioning a quantity of silicon in contact with one surface of a body of crystalline P conductivity type silicon carbide semiconductor material and fusing said silicon into said surface of said body of P conductivity type silicon carbide semiconductor material in the presence of a gas containing an N conductivity type determining impurity, whereby said surface becomes N type degenerately doped material.

13. The process as set forth in claim 12 wherein said gas is nitrogen.

14. The process of forming an electrical device of a body of silicon carbide semiconductor material including a p-n junction comprising in combination the steps of positioning a quantity of silicon in contact with one surface of a degenerately doped body of crystalline P conductivity type silicon carbide semiconductor material and fusing said silicon into said surface of said body of P conductivity type silicon carbide semiconductor material in the presence of a gas containing nitrogen as an N conductivity type determining impurity, whereby said surface becomes N type degenerately doped material, and applying an ohmic contact to each of said body of silicon carbide semiconductor material and to said silicon.

15. The process as set forth in claim 14 wherein said p-n junction is abrupt.

16. The process as set forth in claim 14 wherein said device has a negative resistance portion in its current-voltage characteristic.

17. The process of forming an electrical device of a body of silicon carbide semiconductor material comprising in combination the steps of positioning a quantity of silicon in contact with one surface of a body of crystalline P conductivity type silicon carbide semiconductor material and fusing said silicon into said surface of said body of P conductivity type silicon carbide semiconductor material in the presence of a gas comprising 90% nitrogen and 10% hydrogen at a temperature in the vicinity of 2000° centigrade for a period of ten (10) seconds, whereby said surface becomes N type degenerately doped material, and applying an ohmic contact to each of said body of silicon carbide semiconductor material and to said silicon.

18. The method of making a fused electrical connection to silicon carbide comprising the steps of placing a quantity of silicon containing less than one percent of a conductivity type determining impurity in contact with a surface of a body of silicon carbide containing approximately $10^{20}$ atoms of aluminum per cubic centimeter and cycling the temperature of the combination of said silicon carbide body and said silicon in the presence of 90% nitrogen and 10% hydrogen gas, to approximately 2000° C. and back to room temperature in approximately 10 seconds to produce said fused connection, whereby said fused connection is N type degenerately doped material.

References Cited by the Examiner

UNITED STATES PATENTS

| | | | |
|---|---|---|---|
| 2,854,364 | 9/1958 | Lely | 148—174 |
| 2,887,453 | 5/1959 | Billig et al. | 317—234 X |
| 2,918,396 | 12/1959 | Hall | 317—237 X |
| 2,937,323 | 5/1960 | Kroko et al. | 317—234 |
| 2,937,324 | 5/1960 | Kroko | 317—234 |
| 3,082,126 | 3/1963 | Chang | 148—1.5 |
| 3,124,454 | 3/1964 | Berman. | |
| 3,201,666 | 8/1965 | Hall | 317—237 |

References Cited by the Applicant

Busch, G. and Labhart, H., Helvitica Physica Acta, vol. 19, 1946; pp. 463–492.

Choyke, W. J. and Patrick, L., Physical Review, No. 105, 1957; pp. 1721–1723.

Lehovec, Accardo and Jamgochiam, Physical Review, vol. 89, 1953; pp. 20–25.

Newman, R., Physical Review, No. 100, 1955; pp. 700–703.

Patrick, L., Journal of Applied Physics, vol. 28, 1957, pp. 765–776.

JOHN W. HUCKERT, *Primary Examiner.*

A. M. LESNIAK, *Assistant Examiner.*